United States Patent [19]
Moore

[11] Patent Number: 5,821,803
[45] Date of Patent: Oct. 13, 1998

[54] METHOD AND ELECTRONIC DEVICE FOR REDUCING TRANSITION TIME OF TRANSISTOR SWITCHING CIRCUITS

[75] Inventor: Bruce D. Moore, Santa Clara, Calif.

[73] Assignee: Maxim Integrated Products, Inc., Sunnyvale, Calif.

[21] Appl. No.: 878,891

[22] Filed: Jun. 19, 1997

[51] Int. Cl.$^6$ .................... H03K 17/042; H03K 17/0414
[52] U.S. Cl. .......................... 327/374; 327/376; 327/377
[58] Field of Search ..................................... 327/168, 374, 327/376, 380, 381, 427, 430, 431, 435, 437

[56] References Cited

U.S. PATENT DOCUMENTS

| | | | |
|---|---|---|---|
| 3,943,453 | 3/1976 | Melchior | 328/123 |
| 4,549,095 | 10/1985 | Stefani et al. | 307/254 |
| 5,410,190 | 4/1995 | Carobolante | 327/110 |
| 5,475,329 | 12/1995 | Jones et al. | 327/377 |

OTHER PUBLICATIONS

Maxim Integrated Products Data Sheet No. 19–0221, Rev. 2, Apr. 1996, pp. 1–32.

*Primary Examiner*—Timothy P. Callahan
*Assistant Examiner*—An T. Luu
*Attorney, Agent, or Firm*—Hickman & Martine, LLP

[57] ABSTRACT

The present invention teaches a variety of electrical devices and methods for connecting a switch such as a transistor to decrease a voltage drop across an electrical coupling connecting the switch's source with a gate driver regulating operation of the switch, the voltage drop due, at least in part, to a change in current flowing through the switch. Decreasing the voltage drop from the switch's source to the gate driver tends to improve the operational characteristics of the switch. One embodiment of the present invention teaches an electronic device including a switch having a gate, a drain, and a source, and a plurality of source terminals. A gate bias voltage $V_{gs}$ (the voltage potential from the gate to the source) controls a flow of current through the switch between the drain and the source. The source terminals are each connected to the source by a distinct electrical coupling, each of the electrical couplings having some inductance. A first source terminal is coupled with a load driven by a first portion of a current flowing through the switch. A second source terminal is coupled with a gate driver driven by a second portion of the current flowing through the switch. The electronic device operates such that when current varies across the switch, a voltage differential between the source and the second source terminal is caused by a change in current across the inductance of the coupling between the second source terminal and the source.

23 Claims, 5 Drawing Sheets

METHOD AND ELECTRONIC DEVICE FOR REDUCING TRANSITION TIME OF TRANSISTOR SWITCHING CIRCUITS

DESCRIPTION

1. Technical Field

The present invention is related to high-speed power switching. In particular, methods and electronic devices for reducing the switching time of transistor switching circuits are disclosed.

2. Background Art

Circuitry employing power switching can be found within a wide variety of electronic devices. For example, a common technique for generating a stable DC power supply is to use a switch-mode DC-DC converter (i.e., buck topology circuit) in order to generate the desired stable DC power from some source of unregulated DC power. A primary component of the buck circuit is a discrete power MOSFET that switches the unregulated DC power as part of the mechanism for generating the regulated DC power.

FIG. 1 is a schematic diagram of a buck circuit 10 of the prior art. The relevant characteristics of prior art transistor switching circuits will be discussed using the buck circuit 10 as an example. Since the issues addressed by the present invention are common to power switching circuits in general, the following description of the buck circuit 10 is intended to be illustrative and in no way limiting of the present invention. The use of the present invention in a buck circuit (as described in a later section of the patent specification) is merely one of many embodiments of the present invention.

The buck circuit 10 includes an n-channel Metal-Oxide Semiconductor Field Effect Transistor (MOSFET) switch 12, a diode 14, an inductor 16, and a capacitor 18. The switch 12 has a drain 20, a body 22, a source 24, and a gate 26. Voltage $V_{DC}$ is an unregulated source of DC voltage connected to the drain 20. The body 22 and the source 24 are electrically coupled together with one terminal of the inductor 16 and the cathode of the diode 14. The other terminal of the inductor 16 is connected to a terminal of the capacitor 18, at which connection the output voltage $V_{out}$ is generated. The anode of the diode 14 and the other end of the capacitor 18 are coupled to ground 26.

The buck circuit 10 further includes a high-current gate driver 260, a diode 30 and a second capacitor 32. The high-current gate driver 260 has a gate-drive input 262, a gate-drive output 264, a bias point 266 and a gate-drive supply 268. As will be appreciated, the gate driver 260 is typically a big CMOS inverter. The gate-drive output 264 is coupled to the gate 26. Power is provided to the gate driver 260 via the bias point 266 and the gate-drive supply 268. A floating supply voltage $V_{bias}$ (i.e., $V_{bias}$ is not ground referenced) is applied at the bias point 266, and the voltage $V_s$ is coupled to the gate-drive supply 268. The floating supply voltage $V_{bias}$ is generated at the cathode of the diode 30 by coupling a voltage $V_{supply}$, the diode 30 and the second capacitor 32 serially with the voltage $V_{source}$.

The gate driver 260 operates such that the maximum value of the voltage output $V_{co}$ is limited by the sum of the voltages $V_{bias}+V_s$. The gate driver 260 driven by a pulse train voltage $V_{sw}$ (illustrated in FIG. 2) applied at the gate-drive input 262 generates a pulse train $V_{co}$ (illustrated in FIG. 4) time-related to $V_{sw}$, but with pulses having a maximum voltage of about $V_{bias}+V_s$. The gate current $I_g$ is an AC current as illustrated in FIG. 3. Since in the buck circuit 10 the gate voltage $V_g$ is equivalent to the gate-drive supply voltage $V_{cs}$, during the "on" portion of the square wave signal $V_{co}$, the difference between the gate 24 and the source 26 is $V_{bias}$. Hence, $V_{bias}$ is best chosen as a large enough value to drive the MOSFET switch 12 into saturation. As will be appreciated, for the buck circuit 10 the output $V_{out}$ represents a time average of the AC voltage generated at the source 24.

The ideal switch 12 shown in FIG. 1 cannot be realized in practice. In particular, forming electrical couplings between the switch and other devices inevitably results in parasitic electrical effects. For example, a MOSFET switch is typically formed within an integrated circuit package. The MOSFET switch formed within an integrated circuit package requires bond pads, wiring, and external terminals in order to connect the switch to external devices. These connections inevitably introduce parasitic capacitance and inductance.

For example, FIG. 5 illustrates a detailed schematic of how a discrete power MOSFET 12 is commonly formed within an integrated circuit package 60. For example, the discrete power MOSFET IRF-7413 manufactured by International Rectifier could be represented schematically by the integrated circuit package 60 of FIG. 5.

The integrated circuit package 60 includes a MOSFET switch 12, four drain terminals 62, four drain couplings 63, three source terminals 64, three source couplings 65, a gate terminal 66, and a gate coupling 68. The MOSFET switch 12 has a drain 20, a body 22, a source 24, and a gate 26. As in most discrete power MOSFETs, the body 22 and the source 24 are electrically coupled within the integrated circuit package 60. The four drain terminals 62 are electrically coupled to the drain 20 by the four drain couplings 63. The three source terminals 64 are electrically coupled to the source 24 by the three source couplings 65. Finally, the gate terminal 66 is electrically coupled to the gate 26 by the gate coupling 68.

The electrical couplings drawn in the integrated circuit package 60 represent the package leads, bonding wires and bonding pads necessary to interface the MOSFET switch 12 with devices external to the integrated circuit package 60. However, these elements introduce unintended parasitic effects. The parasitic electrical effects are represented by an impedance Z shown in each of the electrical couplings. As will be appreciated, parasitic impedance Z may not be exactly identical for each electrical coupling. However, for the discussion of the present invention, it is sufficient to simply assume that all the impedances Z are equivalent.

Each impedance Z includes some inductance. Since a change in current across an inductor results in a voltage potential across the inductor (recall that V=dI/dt*L), any change in the flow of current across the transistor causes a voltage potential across the relevant electrical coupling.

FIG. 6 illustrates a detailed schematic of the buck circuit 10' formed using a discrete power MOSFET switch as described above with reference to FIG. 5. For simplicity, an integrated circuit package 70 of FIG. 6 is shown having only those parasitic devices believed relevant to the description of the present invention.

The integrated circuit package 70 includes a MOSFET switch 12 having four drain terminals 72, three source terminals 74, and a single gate terminal 76. Each of these terminals has an electrical coupling connecting the terminal to its corresponding portion of the MOSFET switch 12. As will be appreciated, these electrical couplings each comprise a package lead and a bond wire. Shown internal to the integrated circuit package 70 are parasitic gate and source inductances Lg and Ls caused, at least in part, by the package leads and bond wires.

The intended purpose of the multiple source terminals 74 is to provide as low impedance a path as possible from the drain terminals 72 to the source terminals 74 when the switch 12 is conducting. By way of reference, standard nomenclature refers to the resistance of the steady state conducting transistor as $R_{DS}$ or $R_{on}$. To minimize $R_{DS}$, the prior art teaches coupling each of the source terminals 74 together at a node N1 external to the integrated circuit package 70. Connecting the three electrical couplings in parallel results in a decreased impedance. As will be appreciated, the lower the impedance, the lower the $R_{DS}$ (or on resistance). The node N1 would be coupled to both the gate-drive supply 68 of the gate driver 60 and the diode 14. Typically the multiple drain terminals 72 would also be coupled together external to the integrated circuit package and coupled to a voltage $V_{DC}$.

The gate 26 appears capacitive and thus only alternating current flows to the gate. Once the gate capacitance is charged, there is no change in current across the parasitic inductances Ls and they thus each operate essentially as a short circuit coupling the source 24 to the node N1. However, when the MOSFET switch 12 switches from a nonconducting state to a saturation state, which is the desired behavior, there is an abrupt change in the current I1 from zero to the demand current. Because a voltage drop across an inductor is controlled by the equation V =di/dt*L, there will be a voltage differential between the source 24 and the node N1 during the abrupt current change due to the parasitic inductance $L_s$.

A sample calculation shows the effect of the parasitic inductance $L_s$ on the actual gate bias voltage $V_{gs}$. Typical discrete power MOSFETs commonly used in portable power supply applications have a parasitic source terminal inductance of about 4 nH. When the goal is to switch 10 Amps in 10 nsecs, the resulting voltage rise on the source terminal (opposing the gate driver signal) is $L_s$*dI/dt=4 nH*10 Amps/ 10 nsecs=4 Volts. If the gate driver voltage $V_{bias}$ is 5 Volts (a typical value), the instantaneous effective gate bias voltage $V_{gs}$ is reduced to 1 Volt (5 Volts−4 Volts). As will be appreciated, 1 Volt is insufficient to even turn on most MOSFET switches, much less drive such switches into saturation as desired.

Thus as a direct result of the parasitic inductance, the MOSFET switch 12 suffers switching delays due to the time required for the voltage spikes generated by the parasitic inductances to settle. The switching delays mean that transistor switching circuits such as the buck circuit 10 are inefficient because power is dissipated during the switching time due to voltage and current existing simultaneously across the switch. Not only will this inefficiency reduce the operating time of battery-powered systems, the lost electrical power is dissipated as heat. As will be appreciated, heat generation within an electrical device detrimentally effects the device's operation and can lead to component failure.

The problematic issues raised by switching delays in the above described DC-DC voltage converters are also present in other transistor circuits that require large gate-source bias voltages to turn them on. What are needed are methods and apparatus for decreasing the transition time of transistor switches, especially when used as high current switches.

DISCLOSURE OF THE INVENTION

In order to achieve the foregoing and in accordance with the present invention, the present invention teaches a variety of electrical devices and methods for connecting a switch such as a transistor to decrease a voltage drop across an electrical coupling connecting the switch's source with a gate driver regulating operation of the switch. The voltage drop is due, at least in part, to a change in current flowing through the switch.

A first embodiment of the present invention teaches an electronic device including a switch and a plurality of source terminals. The switch has a gate, a drain, and a source, and operates such that a gate bias voltage $V_{gs}$ (the voltage potential from the gate to the source) controls a flow of current through the switch between the drain and the source. The source terminals are each connected to the source by a distinct electrical coupling, each of the electrical couplings having some inductance. A first one of the plurality of source terminals is intended for coupling with a load that is to be driven by a first portion of a current flowing through the switch. A second one of the plurality of source terminals is intended for coupling with a gate driver that is to be driven by a second portion of the current flowing through the switch. The electronic device operates such that when current changes across the switch, a voltage differential between the source and the second source terminal is caused by a change in current across the inductance of the coupling between the second source terminal and the source.

A separate embodiment of the present invention is directed towards a method for switching current across a switch having a gate, a drain, and a source. The switch works such that a gate bias voltage $V_{gs}$ controls a flow of current through the switch between the drain and the source, the gate bias voltage $V_{gs}$ being a voltage potential of the gate over the source, a conductance of the switch dependent upon characteristics of the gate bias voltage $V_{gs}$. The method includes electrically coupling a DC power source to the drain and providing a plurality of source terminals each separately connected to the source by a corresponding plurality of source couplings. The method further includes coupling a first one of the plurality of terminals to a supply input of a gate driver (a voltage $V_1$ is present on the first terminal), coupling a second one of the plurality of terminals to a load, coupling a bias voltage to a voltage bias input of the gate driver, receiving an input signal having a voltage $V_{sw}$ at an input of the gate driver, and generating a command voltage $V_c$ for driving the gate using the gate driver. The command voltage corresponds to the voltage $V_{sw}$, the command voltage $V_c$ has a saturation value of $V_{bias}+V_1$, and the input signal $V_{sw}$ is operable to drive the gate driver into saturation periodically. The method operates such that when current is switched across the switch, a first voltage differential between the source and the second source terminal is caused by a change in current across the inductance of the coupling between the second source terminal and the source, and a second voltage differential between the source and the first source terminal is caused by a change in current across the inductance of the coupling between the first source terminal and the source.

These and other advantages of the present invention will become apparent upon reading the following detailed descriptions and studying the various figures of the drawings.

BEST MODES FOR CARRYING OUT THE INVENTION

Switch delay in transistor switching circuits (resulting in problematic heat generation and power inefficiencies) is caused, in part, by voltage drops across the electrical coupling connecting a switch's source with a gate driver turning the switch on and off. These voltage drops are caused by changes in the flow of current through the switch. Change in current through the switch may be caused, for example, by the switch transitioning on. The present invention teaches a number of electrical devices and methods for connecting electrical devices to decrease the voltage drop across the electrical coupling connecting the switch's source with the gate driver, thereby improving switching time.

Figure 7:
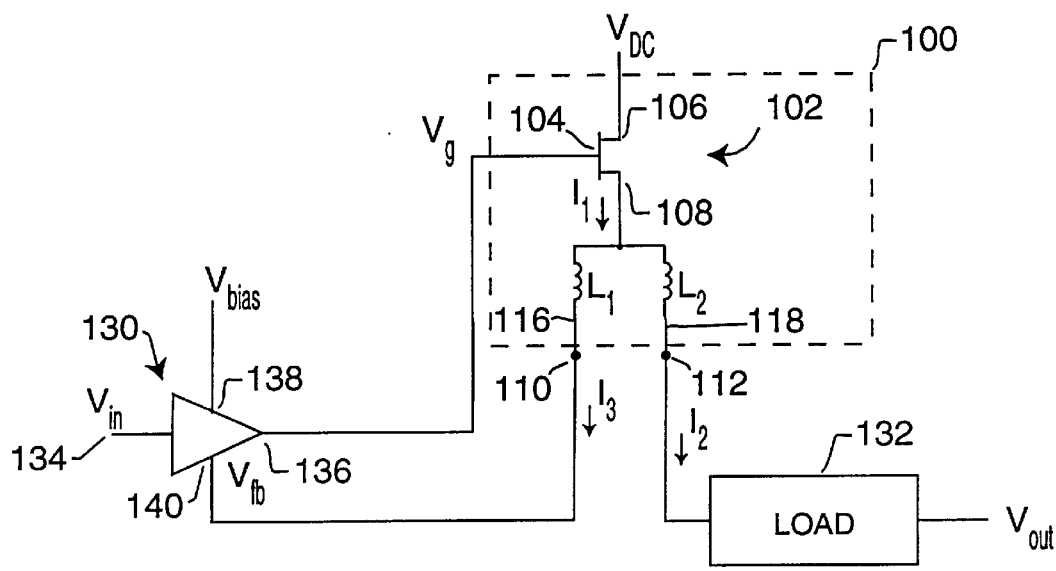
FIG. 7 is a schematic illustration of a switch in accordance with one embodiment of the present invention.

With reference to FIG. 7, an electronic device 100 in accordance with one embodiment of the present invention will now be described. The electronic device 100 includes a switch 102 having a gate 104, a drain 106, and a source 108, first and second source terminals 110 and 112, and first and second electrical couplings 116 and 118. First and second electrical couplings 116 and 118 each electrically connect, respectively, first and second source terminals 110 and 112 with the source 108. As shown in FIG. 7, the first electrical coupling has an inductance L1 and the second electrical coupling has an inductance L2. As will be appreciated, there may be further circuit elements present in the electronic device, whether intentional or parasitic, that are not directly relevant to the present invention.

The switch 102 may be any suitable electronic switch operable to conduct a current I1 from the drain 106 to the source 108 whenever a predefined voltage relationship exists between the gate 104 and the source 108. For example, in one preferred embodiment the switch 102 is an enhancement mode n-channel MOSFET. The enhancement mode n-channel MOSFET switch 102 is nonconducting with a zero (or negative) gate bias voltage $V_{gs}$, and is driven into conduction by bringing a gate voltage $V_g$ positive with respect to a voltage $V_s$ at the source 108. (The gate bias voltage $V_{gs}=V_g-V_s$.) However, one skilled in the art will understand how the present invention applies to other switches such as an enhancement mode p-channel MOSFET switch.

FIG. 7 further illustrates a gate driver 130 and a load 132. The gate driver 130 turns the switch 100 on and off, while the load 132 is driven by a portion of the current I1.

The gate driver 130 has a gate-drive input 134, a gate-drive output 136, a bias point 138 and a gate-drive supply 140. The gate-drive input 134 is electrically coupled to an input signal having a pulse train $V_{in}$, the gate-drive output 136 is electrically coupled to the gate 104, the bias point 138 is electrically coupled to a bias voltage $V_{bias}$, and the gate-drive supply 140 is coupled to the first source terminal 110. The gate driver 130 generates an output signal having the voltage $V_g$ in response to the input voltage $V_{in}$, the bias voltage $V_{bias}$, and a voltage present on the first source terminal.

As the switch 102 is closed, current I1 flows from the drain 106 to the source 108 and is divided between the first and second electrical couplings 116 and 118. The load 132 draws a load current I2 through the second electrical coupling 118, while the gate driver 130 draws a short-lived AC current I3 through the first electrical coupling 116, the current I3 caused by the capacitance of the gate 104.

Note that the inductance L1 from the first source terminal 110 to the source 108 is greater than the inductance would be were the first and second source terminals 110 and 112 coupled together (recall that for parallel inductors L1' and L2', total inductance=(L1'*L2')/(L1'+L2')). Since the voltage drop caused by a change in current is directly proportional to the inductance (recall that V=dI/dt*L), the larger inductance would tend to generate a larger voltage drop. However, typically the load current I2 is substantially greater than the gate-drive current I3. Likewise, when current is switched through the switch 102, the change in current dI2/dt is substantially greater than the change in current dI3/dt. Keeping the first and second source terminals 110 and 112 uncoupled tends to result in smaller voltage drops across the first electrical coupling 116 than would coupling the first and second source terminals 110 and 112 together. As a direct result, the operational characteristics (namely switching speed) of the switch 102 are improved.

Figure 8:
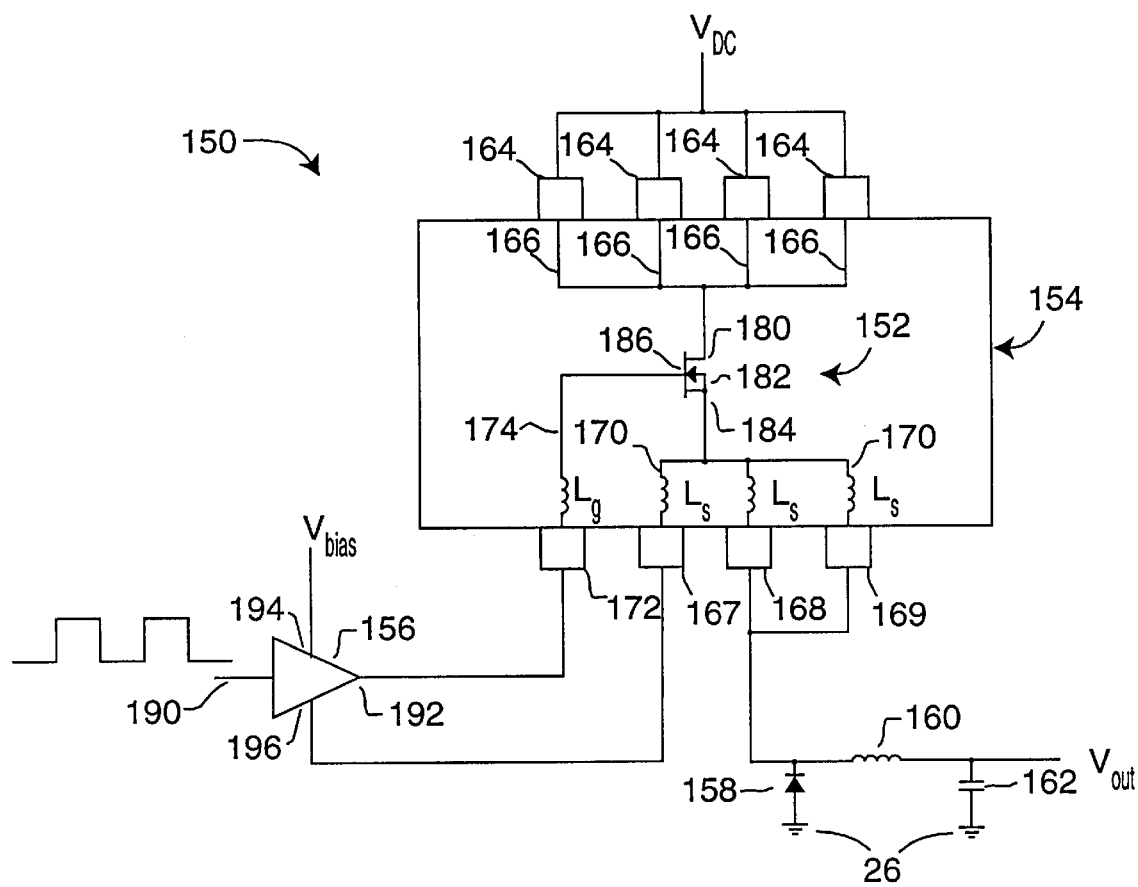
FIG. 8 is a schematic illustration of a buck circuit in accordance with another embodiment of the present invention.

With reference to FIG. 8, a buck circuit 150 in accordance with one embodiment of the present invention will now be described. The buck circuit 150 includes a discrete power n-channel MOSFET switch 152 formed within an integrated circuit package 154, a gate driver 156, a diode 158, an inductor 160, and a capacitor 162.

The gate driver 156 includes a gate-drive input 190, a gate-drive output 192, a bias point 194 and a gate-drive supply 196. A pulse train voltage $V_{sw}$ generated by an oscillator and pulse width modulator (PWM) controller or other suitable electronic device is applied at the gate-drive input 190. The gate-drive output 192 is directly coupled to the gate terminal 172, and thus electrically coupled to the gate 186 through the gate coupling 174. A suitable bias voltage $V_{bias}$ is coupled to the bias point 194. The voltage $V_{bias}$ is application dependent, and may be, e.g., +5 Volts DC with respect to the gate-drive supply 196. The gate-drive supply 196 is electrically coupled with a first source terminal 167.

The second and third source terminals 168 and 169 are coupled together external to the integrated circuit package 154 and are further coupled together with a first terminal of the inductor 160 and the cathode of the diode 158. A second terminal of the inductor 160 is connected to a first terminal of the capacitor 162, at which connection the output voltage Vout is generated. The anode of the diode 158 and a second terminal of the capacitor 162 are coupled to a common ground 26.

The integrated circuit package 154 includes four drain terminals 164, four drain couplings 166, three source terminals 167, 168, and 169, three source couplings 170, a gate terminal 172, and a gate coupling 174. The MOSFET switch 152 has a drain 180, a body 182, a source 184, and a gate 186. As in most discrete power MOSFETs, the body 182 and the source 184 are electrically coupled within the integrated circuit package 154. Other embodiments of the present invention contemplate the use of different transistor switches.

The four drain terminals 166 are electrically coupled to the drain 180 by the four drain couplings 166. Typically, the four drain terminals 166 are coupled together external to the integrated circuit package 154 in order to reduce $R_{DS}$. In turn, the four connected drain terminals 166 are coupled to a possibly unsteady DC voltage supply $V_{DC}$. The three source terminals 167, 168, and 169 are each separately coupled to the source 184 by corresponding source couplings 170. The gate terminal 172 is electrically coupled to the gate 186 by the gate coupling 174. As will be appreciated, the electrical couplings each comprise a package lead and a bond wire. Shown internal to the integrated circuit package 154 are parasitic gate and source inductance Lg and Ls caused by the package leads and bond wires.

Figure 1:
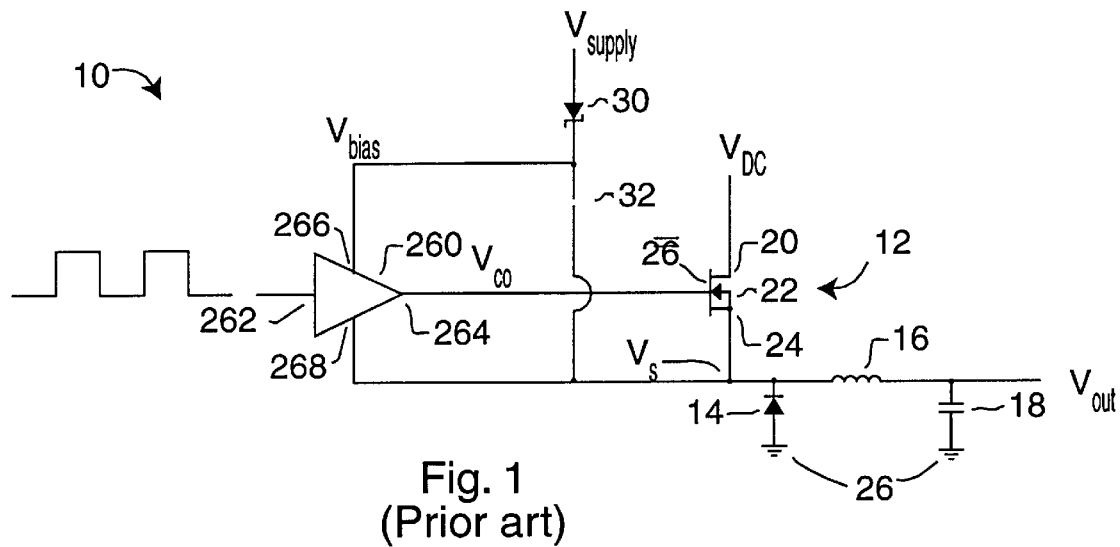
FIG. 1 is a schematic illustration of an ideal buck circuit of the prior art.
Figure 2:
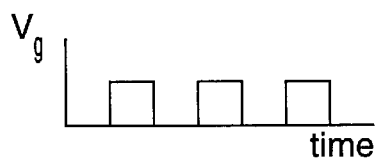
FIG. 2 is a graph plotting a square wave voltage $V_g$ as a function of time, the square wave voltage $V_g$ suitable for driving the gate of the transistor switch of FIG. 1.
Figure 3:
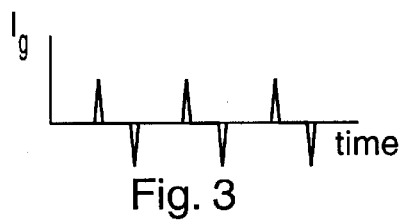
FIG. 3 is a graph plotting a gate current $I_g$ as a function of time, the gate current $I_g$ corresponding to the pulse train voltage Vg of FIG. 2.
Figure 4:
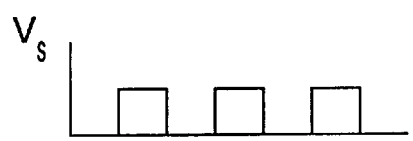
FIG. 4 is a graph plotting a source voltage $V_s$ as a function of time, the source voltage $V_s$ being a response to the application of the square wave voltage $V_g$ of FIG. 2 to the transistor gate of FIG. 1.
Figure 5:
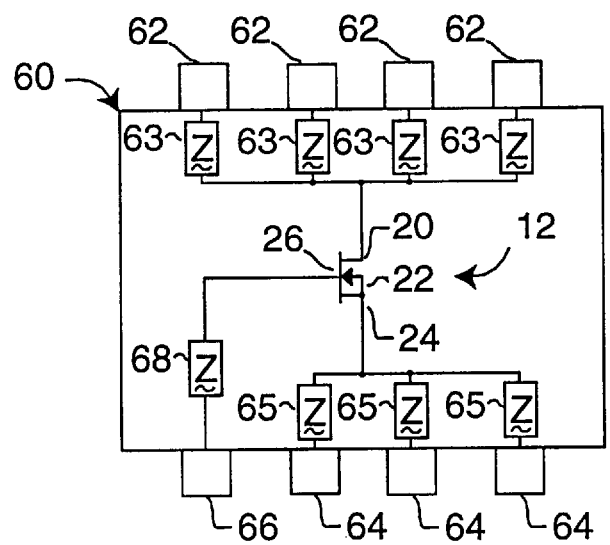
FIG. 5 is a realizable discrete power MOSFET switch of the prior art.
Figure 6:
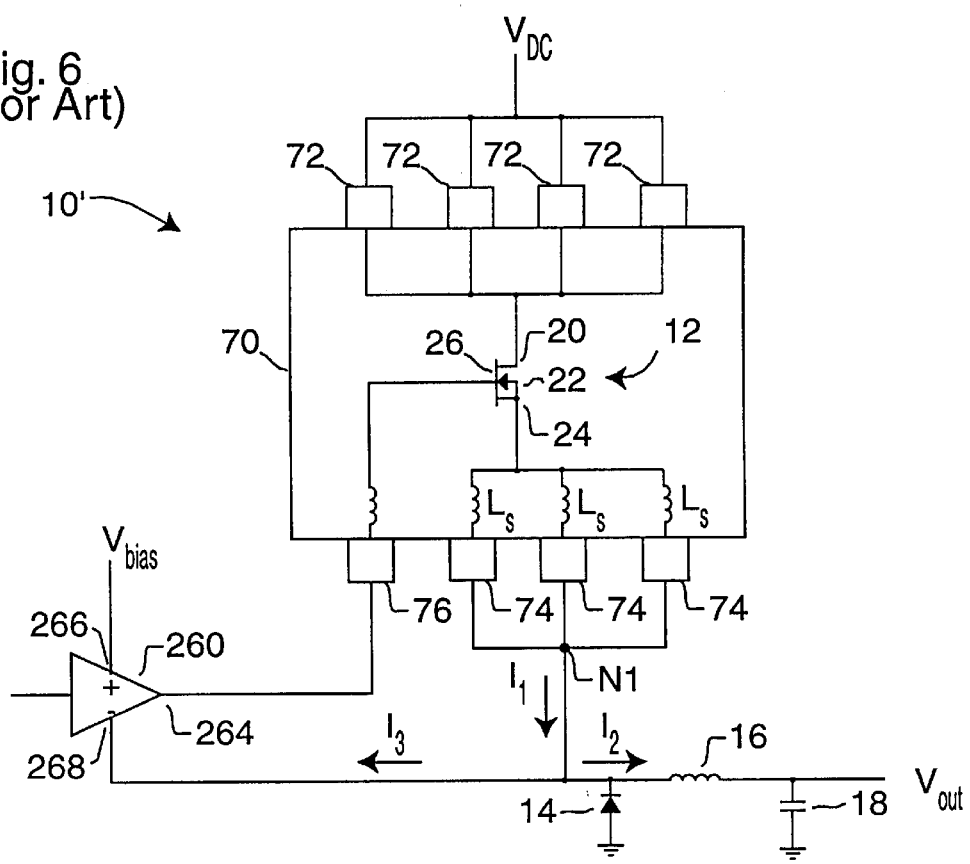
FIG. 6 is a schematic illustration of a realizable buck circuit of the prior art.

As described above with reference to FIG. 6, the source terminals 167, 168, and 169 are intended for coupling together external to the integrated circuit package 154 in order to reduce $R_{DS}$. However, the present invention teaches that only the second and third source terminals 168 and 169 are coupled together and in turn connected to the load, which in FIG. 8 includes the diode 158, the inductor 160, the capacitor 162, and other circuitry not shown that may be connected with $V_{out}$. The first source terminal 167 is connected to the gate-drive supply 196. Leaving the first source terminal 167 uncoupled from the second and third source terminals 168 and 169 tends to result in a smaller voltage drop from the source 184 to the first source terminal 167 during the transition time. This is because, as described above with reference to FIG. 7, the AC current drawn by the gate driver 156 is substantially smaller than the current drawn by any load driven by the source 184.

As will be appreciated, the oscillator, the PWM controller, and the gate driver 156 may be formed together along with other desired components within a single integrated circuit package, or may be separate devices. One such suitable integrated circuit package is the MAX797, manufactured by Maxim Integrated Products, Inc. More details regarding the MAX797 may be found in Maxim data sheet no. 19-0221, Rev. 2, dated April 1996. Likewise, the MOSFET switch 154 and the gate driver 156 may be formed together within a single integrated circuit package. Of course, each of the components may be separate integrated circuit packages formed together on a bread board or some other device suitable for electrically connecting the circuit.

Figure 9:
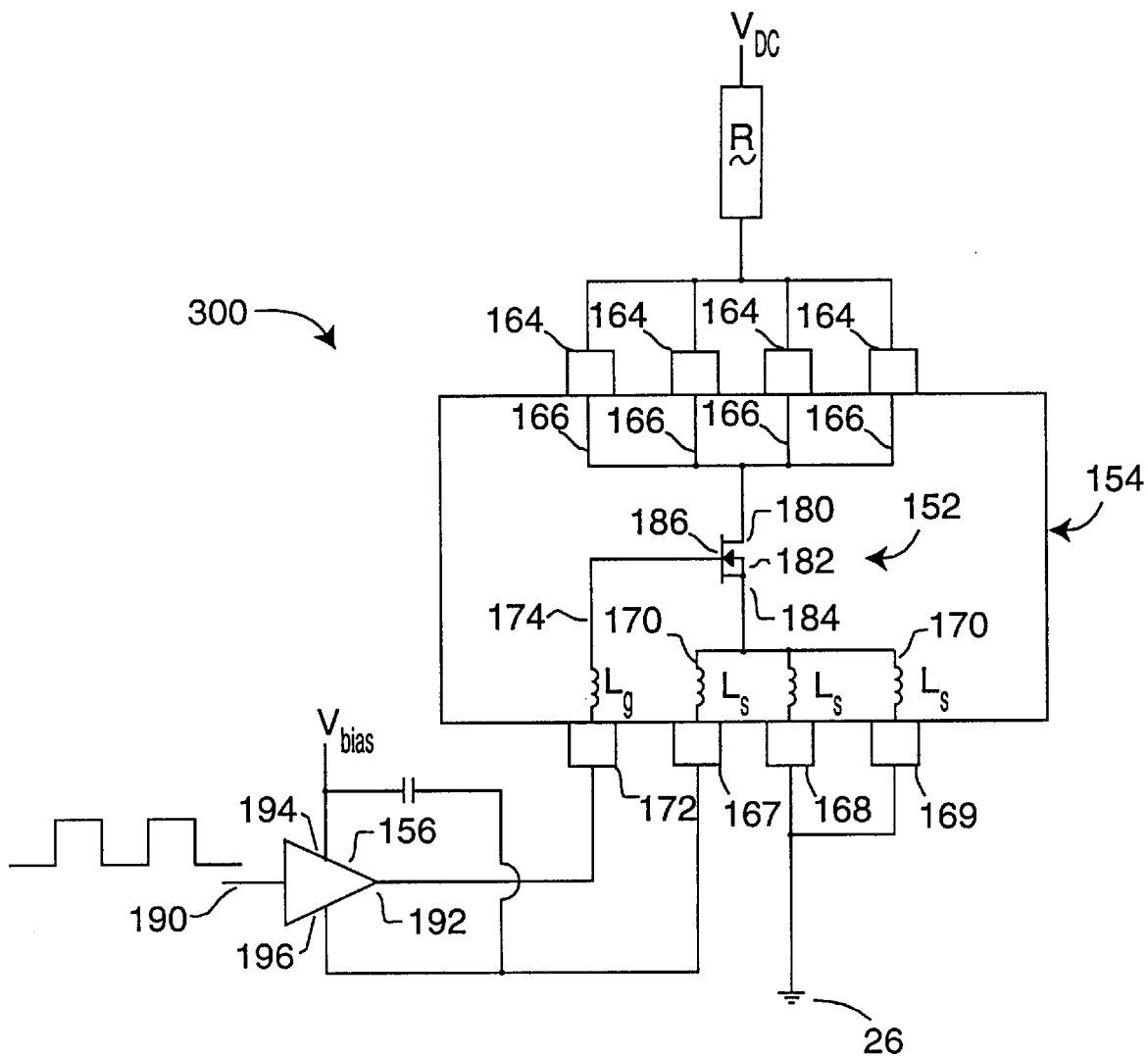
FIG. 9 is a schematic illustration of a MOSFET circuit in accordance with still another embodiment of the present invention.

FIG. 9 is a schematic diagram of an n-channel MOSFET circuit 300 in accordance with another embodiment of the present invention. Because many of the components are the same as those described above with reference to FIG. 8, only those aspects peculiar to the circuit 300 will be described. As will be appreciated, the circuit 300 is suitable for use in a PWM boost converter (where the resistive load would be replaced by an inductor, rectifier diode, and filter capacitor in the classic boost topology).

In the circuit 300, a first terminal 302 of a resistive load R is connected to the voltage supply $V_{DC}$, and a second terminal 304 of the resistive load R is coupled to the four drain terminals 166. The output voltage Vout of the circuit 300 is generated at the second terminal 304. The second and third source terminals 168 and 169 are coupled together and in turn coupled to ground 26. The first source terminal 167 is connected to the gate-drive supply 196. Similar to the buck circuit 150 of FIG. 8, leaving the first source terminal 167 uncoupled from the second and third source terminals 168 and 169 tends to result in a smaller voltage drop from the source 184 to the first source terminal 167 during the transition time of the switch 152.

While the present invention has been described in terms of several preferred embodiments, there are alterations, permutations, and equivalents which fall within the scope of this invention. It should also be noted that there are many alternative ways of implementing both the method and apparatus of the present invention. It is therefore intended that the following appended claims be interpreted as including all such alterations, permutations, and equivalents as fall within the true spirit and scope of the present invention.

I claim:

1. An electronic device comprising:
    a switch having a gate, a drain, and a source, the switch operable such that a gate bias voltage $V_{gs}$ controls a flow of current through the switch between the drain and the source, the gate bias voltage $V_{gs}$ being a voltage potential of the gate over the source; and
    a plurality of source terminals each having an electrical coupling to the source, each particular electrical coupling having a corresponding inductance, wherein at least a first one of the plurality of source terminals is intended for coupling with a load that is to be driven by a first portion of a current flowing through the switch and a second one of the plurality of source terminals is intended for coupling with a gate driver that is to be driven by a second portion of the current flowing through the switch,
    wherein when current is switched through the switch, a voltage differential between the source and the second source terminal is caused by a change in current across the inductance of the coupling between the second source terminal and the source.

2. An electronic device as recited in claim 1 wherein the switch is a field effect transistor (FET).

3. An electronic device as recited in claim 2 wherein the switch is a metal-oxide semiconductor FET (MOSFET).

4. An electronic device as recited in claim 3 wherein the switch is an n-channel MOSFET.

5. An electronic device as recited in claim 3 wherein the switch is a p-channel MOSFET.

6. An electronic device as recited in claim 3 wherein the MOSFET is formed within an integrated circuit package, each electrical coupling between the source and the plurality of source terminals including a corresponding package lead and a corresponding bond wire, the inductance of each electrical coupling being due at least in part to parasitic inductance of the corresponding package lead and the corresponding bond wire.

7. An electronic device as recited in claim 3 wherein the MOSFET is a discrete power MOSFET formed within an integrated circuit package.

8. An electronic device as recited in claim 1 wherein the second source terminal is the only one of the plurality of source terminals not intended for coupling with the load.

9. An electronic device as recited in claim 1 wherein the load is a first load and a third one of the plurality of source terminals is intended for coupling with a second load.

10. An electronic device as recited in claim 1 wherein the load includes a diode having a cathode and an anode, an inductor having a first inductor terminal and a second inductor terminal, and a capacitor having a first capacitor terminal and a second capacitor terminal, wherein the first inductor terminal, the cathode of the diode, and the first source terminal are all electrically coupled together, the second inductor terminal and the first capacitor terminal are electrically coupled together at a node N1, and the anode of the diode and the second capacitor terminal are electrically coupled to a common ground, and further wherein the load serves as a smoothing filter such that an output voltage generated at the node N1 tends to be smoother than a voltage generated at the first source terminal.

11. An electronic device as recited in claim 10 further including a direct current (DC) voltage supply having a voltage $V_{DC}$ electronically coupled to the drain.

12. An electronic device as recited in claim 11 wherein the DC voltage supply is an unregulated voltage supply.

13. An electronic device as recited in claim 11 wherein the DC voltage supply has a different value than that desired at the output voltage.

14. An electronic device as recited in claim 11 wherein the possibly unstable DC voltage $V_{DC}$ is generated by a battery.

15. An electronic device as recited in claim 1 wherein the load includes a real synchronous rectifier having a first rectifier terminal and a second rectifier terminal, an inductor having a first inductor terminal and a second inductor terminal, and a capacitor having a first capacitor terminal and a second capacitor terminal, wherein the first inductor terminal, the first rectifier terminal, and the first source terminal are all electrically coupled together, the second inductor terminal and the first capacitor terminal are electrically coupled together at a node N1, and the second rectifier terminal and the second capacitor terminal are electrically coupled to a common ground, and further wherein the load serves as a smoothing filter such that an output voltage generated at the node N1 tends to be smoother than a voltage generated at the first source terminal.

16. An electronic device as recited in claim 1 wherein the switch is an n-channel MOSFET switch, a load R electrically couples the drain to a voltage supply $V_{DC}$, and the first source terminal is coupled to ground.

17. An electronic device as recited in claim 1 wherein the switch is a p-channel MOSFET switch, a resistive load R couples the drain to ground, the first source terminal is coupled to the gate bias, and the second source terminal is coupled to a voltage supply $V_{DC}$.

18. A transistor comprising:
    a gate;
    a source;
    a drain, the switch being operable such that a gate bias voltage $V_{gs}$ controls a flow of current through the switch between the drain and the source, the gate bias voltage $V_{gs}$ being a voltage potential of the gate over the source, a conductance of the switch dependent upon characteristics of the gate bias voltage $V_{gs}$,
    means for coupling a power source to the drain;
    means for coupling the source to a load;
    means for coupling the source to an input of a gate driver;
    means for coupling the gate to an output of the gate driver;
    wherein said input of the gate driver and the load are not electrically coupled by a short circuit such that when current is switched across the switch, a first voltage differential between the source and the input of the gate driver is caused by a change in current across the means for coupling the source to the input, and a second voltage differential between the source and the load is caused by a change in current across the means for coupling the source to the load.

19. A transistor as recited in claim 18 wherein the transistor is a field effect transistor.

20. A transistor as recited in claim 19 wherein the transistor is a metal-oxide semiconductor field effect transistor (MOSFET).

21. A transistor as recited in claim 20 wherein the switch is an n-channel MOSFET.

22. A transistor as recited in claim 20 wherein the switch is a p-channel MOSFET.

23. A method for switching current across a switch having a gate, a drain, and a source, the switch operable such that a gate bias voltage $V_{gs}$ controls a flow of current through the switch between the drain and the source, the gate bias voltage $V_{gs}$ being a voltage potential of the gate over the source, a conductance of the switch dependent upon characteristics of the gate bias voltage $V_{gs}$, the method including the steps of:
    electrically coupling a DC power source to the drain;
    providing a plurality of source terminals each separately connected to the source by a corresponding plurality of source couplings, each source coupling between a particular source terminal and the source having a corresponding inductance;
    coupling a first one of the plurality of terminals to a supply input of a gate driver, a voltage $V_1$ being present on the first terminal;
    coupling a second one of the plurality of terminals to a load;
    coupling a bias voltage to a voltage bias input of the gate driver;
    receiving an input signal having a voltage $V_{sw}$ at an input of the gate driver;
    generating a command voltage $V_c$ for driving the gate using the gate driver, the command voltage corresponding to the voltage $V_{sw}$, the command voltage $V_c$ having a saturation value of $V_{bias}+V_1$, the input signal $V_{sw}$ operable to drive the gate driver into saturation periodically,
    wherein when current is switched across the switch, a first voltage differential between the source and the second source terminal is caused by a change in current across the inductance of the coupling between the second source terminal and the source, and a second voltage differential between the source and the first source terminal is caused by a change in current across the inductance of the coupling between the first source terminal and the source.

* * * * *

UNITED STATES PATENT AND TRADEMARK OFFICE
CERTIFICATE OF CORRECTION

PATENT NO.    : 5,821,803
DATED         : October 13, 1998
INVENTOR(S)   : Moore It is certified that error appears in the above-identified patent and that said Letters Patent is hereby corrected as shown below:

Column 6, line 23, in order to be mathematically consistent change "))" to --)--

Signed and Sealed this

Ninth Day of May, 2000

Attest:

Q. TODD DICKINSON

*Attesting Officer*                *Director of Patents and Trademarks*